(12) United States Patent
Kim

(10) Patent No.: US 6,678,289 B2
(45) Date of Patent: Jan. 13, 2004

(54) WAVELENGTH-TUNABLE LASER APPARATUS

(75) Inventor: Jong-Ryeol Kim, Suwon-shi (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/370,796

(22) Filed: Feb. 20, 2003

(65) Prior Publication Data

US 2003/0169785 A1 Sep. 11, 2003

(30) Foreign Application Priority Data

Mar. 11, 2002 (KR) .................. 10-2002-0012963

(51) Int. Cl.[7] .............................................. H01S 3/10
(52) U.S. Cl. ........................... 372/20; 372/98; 372/96; 372/32; 359/344
(58) Field of Search ................ 372/20, 98, 43–46, 372/102, 96, 32, 47–50; 359/344

(56) References Cited

U.S. PATENT DOCUMENTS

| 6,347,104 B1 | * | 2/2002 | Dijaili et al. | 372/38.01 |
| 6,445,495 B1 | * | 9/2002 | Walker et al. | 359/344 |
| 6,563,631 B2 | * | 5/2003 | Delprat et al. | 359/344 |
| 2002/0067540 A1 | * | 6/2002 | Delprat et al. | 359/344 |
| 2002/0196821 A1 | * | 12/2002 | Jang et al. | 372/32 |
| 2003/0086655 A1 | * | 5/2003 | Deacon | 385/50 |
| 2003/0169785 A1 | * | 9/2003 | Kim | 372/20 |

* cited by examiner

*Primary Examiner*—Leon Scott, Jr.
(74) *Attorney, Agent, or Firm*—Cha & Reiter, L.L.C.

(57) ABSTRACT

The present invention provides a wavelength-tunable laser apparatus which is capable of obtaining a high output while suppressing the generation of spontaneous emission, as well as having a broad wavelength-tunable range. In particular, the apparatus includes a distributed reflector section which comprises a first active layer for oscillating light, a first grating for filtering the light generated in the first active layer, and upper and lower clad layers between which the first active layer and the first grating are interposed; a gain section which is formed adjoining to a side of the distributed reflector section and comprises a second active layer disposed between the upper and lower clad layers for adjusting the gain of the light; and a gain-clamped semiconductor optical amplifier section formed adjoining to a side of the gain section, wherein the gain-clamped semiconductor optical amplifier section comprises a third active layer disposed between the upper and lower clad layers for amplifying the light to have a clamped gain and a second grating for filtering the light passing through the third active layer.

9 Claims, 2 Drawing Sheets

WAVELENGTH-TUNABLE LASER APPARATUS

CLAIM OF PRIORITY

This application claims priority to an application entitled "WAVELENGTH-TUNABLE LASER APPARATUS" filed in the Korean Industrial Property Office on Mar. 11, 2002 and assigned Serial No. 2002-12963, the contents of which are hereby incorporated by reference.

BACKGROUND OF THE INVENTION

1. Field of the Invention

The present invention relates to an optical communication system, and more particularly to a semiconductor laser for use in an optical communication system.

2. Description of the Related Art

Optical communication systems employ wavelength division multiplexing (WDM) mode, which simultaneously transmits to a single optical fiber by dividing a low-loss wavelength band of an optical fiber into a plurality of channels and multiplexing the channels. In high-capacity wavelength division multiplexing (WDM) optical network, the capability to remove and replace selective WDM wavelengths at multiple add/drop nodes across the network is essential for a variety of value-added communication services.

An example of a semiconductor laser with a distributed Bragg reflector (DBR) is disclosed in U.S. Pat. No. 5,748,660 to Franck Delorme et al., entitled "SAMPLE GRATING DISTRIBUTED BRAGG REFLECTOR LASER, VERY WIDELY MATCHABLE BY PHASE VARIATION AND PROCESS FOR USING THIS LASER," which discloses a semiconductor laser comprising an active section and two sample rating sections each positioned on a side of the active section.

An example of a semiconductor laser which is provided with a DBR and is capable of tuning output wavelength in accordance with input current is disclosed in U.S. Pat. No. 5,325,392 to Tohmori Yuichi et al., entitled "DISTRIBUTED REFLECTOR AND WAVELENGTH-TUNABLE SEMICONDUCTOR LASER," which discloses a wavelength-tunable laser provided with a distributed reflector which may be of a distributed reflector type or distributed feedback type and has distributed reflector regions and a phase adjustment region.

The wavelength-tunable lasers are constructed in a mode that uses an active distributed Bragg reflector structure. The Bragg reflector structure is used to change the oscillating wavelength by changing the refractive index of the active distributed reflector as electric current is applied thereto. The wavelength-tunable lasers of this mode are separately provided with a semiconductor optical amplifier (SOA) to perform power boosting. Power boosting is needed because the oscillating wavelength is changed to a shorter wavelength as electric current is applied and the optical output rapidly decreases as the change of wavelength is increased.

Power boosting is possible if a semiconductor optical amplifier is connected to a side of a wavelength-tunable laser. However, a problem may arise, due to the saturation output power level being low and noise being increased due to amplified spontaneous emission caused by internal reflection. There is also a problem in that the length of the device should be increased in order to obtain sufficient gain.

SUMMARY OF THE INVENTION

Accordingly, the present invention overcomes or reduces the above-mentioned problems occurring in the prior art glass optical fibers, and one object of the present invention is to provide a wavelength-tunable laser apparatus which is capable of obtaining a high output while suppressing the generation of spontaneous emission, as well as having a broad wavelength-tunable range.

In accordance with principals of the present invention a wavelength-tunable laser apparatus is provided comprising, a distributed reflector section having a first active layer for oscillating light, a first grating for filtering the light generated in the first active layer, and upper and lower clad layers between which the first active layer and the first grating are interposed, a gain section which is formed adjoining to a side of the distributed reflector section and comprises a second active layer disposed between the upper and lower clad layers for adjusting the gain of the light, and a gain-clamped semiconductor optical amplifier section which is formed adjoining to a side of the gain section and comprises a third active layer disposed between the upper and lower clad layers for amplifying a portion of light having a clamped gain, and a second grating for filtering the light passing through the third active layer.

BRIEF DESCRIPTION OF THE DRAWINGS

The present invention will be more apparent from the following detailed description taken in conjunction with the accompanying drawings, in which.

DETAILED DESCRIPTION OF THE PREFERRED EMBODIMENTS

Figure 1:
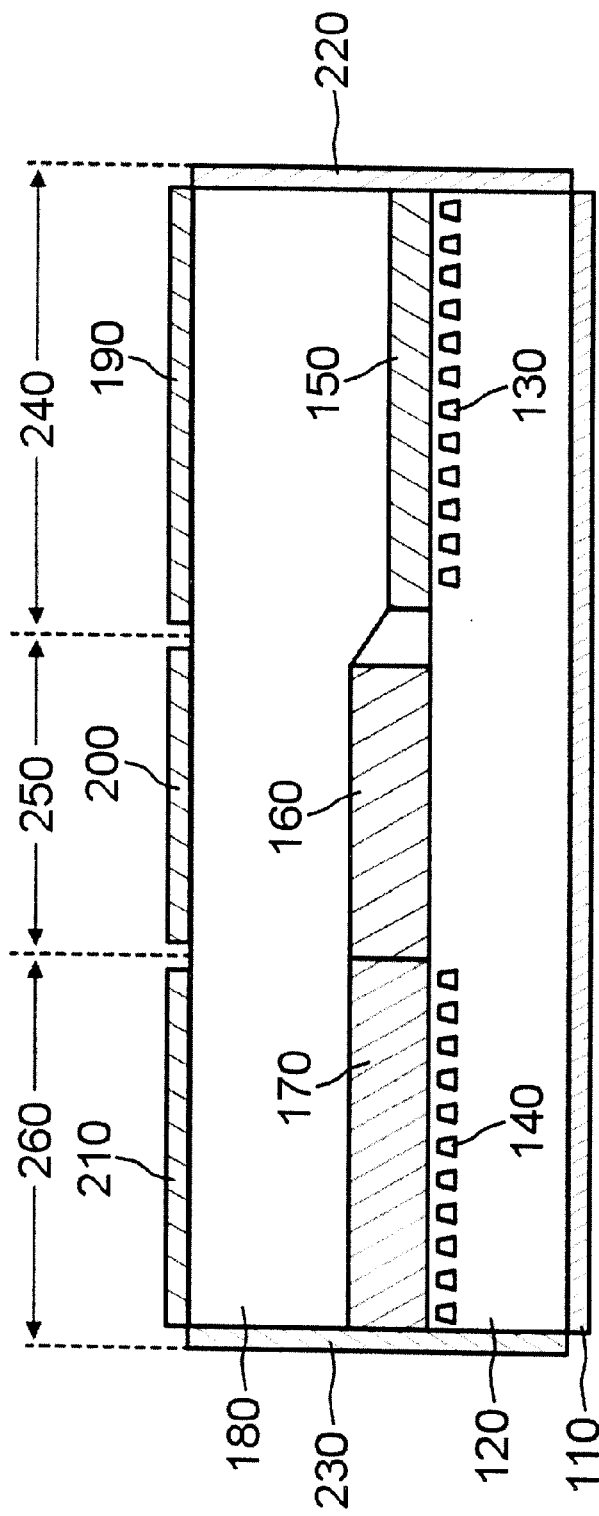
FIG. 1 is a cross-section view showing a construction of a wavelength-tunable laser apparatus according to a preferred embodiment of the present invention.

In the following description of the present invention, for purposes of explanation rather than limitation, specific details are set forth such as the particular architecture, interfaces, techniques, etc., in order to provide a thorough understanding of the present invention. However, it will be apparent to those skilled in the art that the present invention may be practiced in other embodiments that depart from these specific details. Moreover, it will be recognized that certain aspects of the figures are simplified for explanation purposes and that the full system environment for the invention will comprise many known functions and configurations all of which need not be shown here. In the drawings, the same or similar elements are denoted by the same reference numerals even though they are depicted in different drawings.

FIG. 1 shows a cross-section view of a construction of a wavelength-tunable laser apparatus according to the present invention. The laser apparatus are generally divided into a distributed Bragg reflector section 140, a gain section 250 and a gain-clamped semiconductor optical amplifier (SOA) section 260. The laser apparatus further includes a lower clad layer 120, a lower electrode layer 110, first and second gratings 130 and 140, first to third active layers 150, 160 and 170, an upper clad layer 180, first to third upper electrode layers 190, 200 and 210; a high reflection layer 220; and an antireflection layer 230.

The distributed Bragg reflector section 240 includes the lower electrode layer 110, the lower clad layer 120, the first grating 130, the first active layer 150, the upper clad layer 180, the first upper electrode layer 190, and the high reflection layer 220.

The lower clad layer 120 is an n-type InP substrate, which has a relatively low refractive index as compared to the first to third active layers 150, 160 and 170. The lower electrode layer 110 is laminated on the underside of the lower clad layer 120.

The upper clad layer 180 is formed from p-type InP, which has a relatively low refractive index as compared to the first to third active layers 150, 160 and 170. The upper and lower clad layers 120 and 180 have relatively low refractive indexes in order to prevent light entering from the first, second or third active layer 150, 160 or 170 from entering the inside thereof.

The first active layer 150 is formed from InGaAsP and has a quantum well structure. If an electric current of a predetermined level is applied to the first upper electrode layer 190, an electric field is formed in the distributed Bragg reflector section 240. Moreover, electrons from the lower clad layer 120 move to the first active layer 150 and holes from the upper clad layer 180 move to the first active layer 150. Consequently, light will be generated in the first active layer 150 due to the rejoining of the electrons and holes.

The first grating 130 is interposed between the first active layer 150 and the lower clad layer 120 and functions to tune the oscillating wavelengths of the distributed Bragg reflector section 240. Accordingly, the light generated in the first active layer 150 is filtered by the first grating 130 on the basis of a predetermined wavelength. In particular, for light that is incident into the first grating 130, the portion that has the predetermined wavelength is reflected by the first grating 130 and the portion which has a wavelength deviated from the predetermined wavelength is transmitted through the first grating 130 (i.e., introduced into the lower 110 and lost).

The high reflection layer 220 is positioned at an end of the distributed Bragg section 240, which is remote from the gain section 250. Preferably, it is formed from one or more films so that it will have a relatively high refractive index. The high reflection layer 220 realizes the power boosting of the wavelength-tunable laser apparatus in cooperation with the antireflection layer 230, which has a relatively low refractive index.

The gain section 250 is formed adjacent to a side of the distributed Bragg reflector section 240 and consists of the lower electrode layer 110, the lower clad layer 120, the second active layer 160, the upper clad layer 180 and the second upper electrode layer 200.

The second active layer 160 is formed from InGaAsP and has a quantum well structure. The second active layer 160 tunes the gain of light which is generated in the first active layer 150 and introduced into the second active layer 160 in accordance with the electric current of a predetermined level, which is applied to the second upper electrode layer 200.

The gain-clamped SOA section 260 takes a form of distributed feedback and consists of the lower electrode layer 110, the lower clad layer 120, the second grating 140, the third active layer 170, the upper clad layer 180 and the third upper electrode layer 260, and the antireflection layer 230.

The third active layer 170 is formed from InGaAsP and has a quantum well structure. The third active layer 170 tunes the gain of light which is generated in the first active layer 150 and introduced into the third active layer 170 in accordance with the electric current of a predetermined level, which is applied to the second upper electrode layer 210.

The second grating 140 is interposed between the third active layer 170 and the lower clad layer 120, and functions to adjust the oscillating wave length of the gain-clamped SOA section 260. Herein, the oscillating wavelength of the gain-clamp SOA section 260 is set to have a predetermined difference from the oscillating wavelength of the distributed Bragg reflector section 240, to allow for automatic power compensation.

The gain center wavelength of the gain section 250 and the gain-clamped SOA section 260 is tuned by selective area growth (SAG). The SAG is a process used for simultaneously growing two layers of different compositions using a mask. In accordance with the SAG, the layer grown in the exposed region of the mask has a band-gap narrower than the that grown in the non-exposed region of the mask. The band-gap energy between theses two layers is determined depending on the width of the exposed region and the width of the mask itself.

Figure 2:
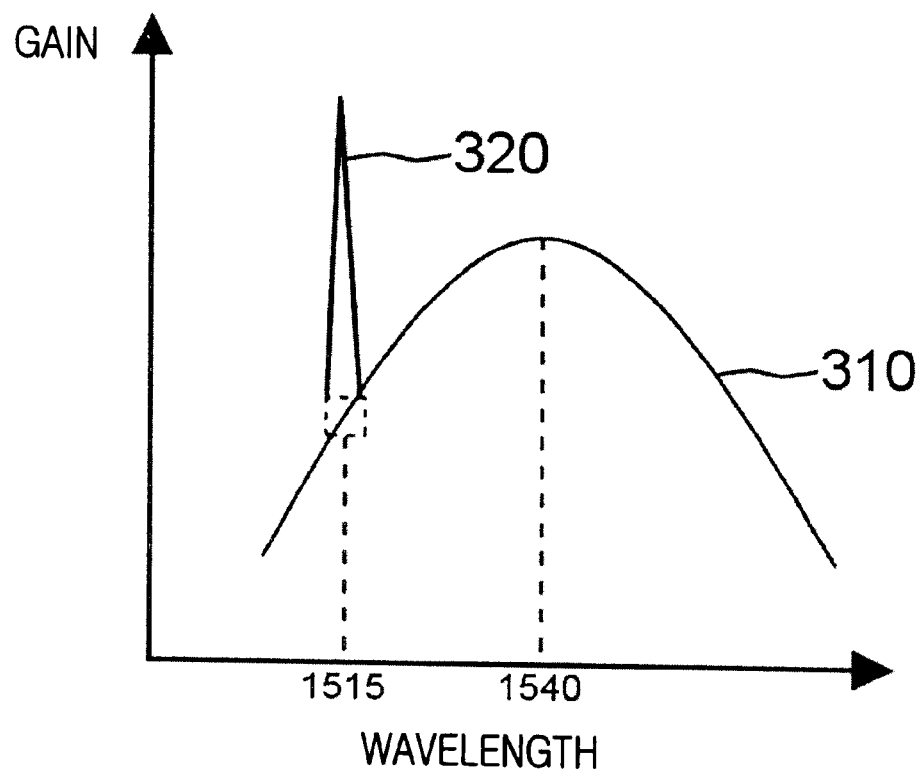
FIG. 2 illustrates output characteristics of the wavelength-tunable laser apparatus shown in FIG. 1.

FIG. 2 illustrates the output characteristics of the wavelength-tunable laser apparatus shown in FIG. 1. As shown, a gain curve is obtained by setting the gain center wavelength of the gain section 250 and the gain-clamped SOA section 260 to 1540 nm using the SAG It can be seen that the gain section 250 and the gain-clamped SOA section 260 compensate a decline of output power caused by wavelength-shortening (from 1565 nm to 1515 nm). Thus, wavelength-shortening corresponding to a band-width of 3 dB (assumed as about 50 nm) after the oscillating wavelength 320 of the distributed Bragg reflector section 240 has been initially set to 1565 nm using the first grating 130. Therefore, it is possible to realize a high output power, which is not lower than a predetermined level, even if the oscillating wavelength of the wavelength-tunable laser apparatus suffers from wavelength-shortening.

Advantageously, the wavelength-tunable laser apparatus has a broad wavelength-tunable region for obtaining high output power. It can suppress the generation of spontaneous emitted light by employing monolithic integration of a gain-clamped semiconductor optical amplifier section adjoining to a gain section.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A wavelength-tunable laser apparatus comprising:
   a distributed reflector section having a first active layer for oscillating light, a first grating for filtering light produced in the first active layer, and upper and lower clad layers between which the first active layer and the first grating are interposed;
   a gain section adjoining a side of the distributed reflector section, the gain section including a second active layer between the upper and lower clad layers for adjusting the gain of the light; and
   a gain-clamped semiconductor optical amplifier section adjoining a side of the gain section, the gain-clamped semiconductor optical amplifier section comprising a third active layer disposed between the upper and lower clad layers for amplifying a portion of the light, and a second grating for filtering the light passing through the third active layer.

2. The wavelength-tunable laser apparatus according to claim 1, further comprising:
   a high reflection layer disposed at an end of the distributed reflector section operable for power boosting; and an antireflection layer disposed at an end of the gain-clamped semiconductor optical amplifier section.

3. The wavelength-tunable laser apparatus according to claim 1, wherein the second active layer is formed from InGaAsP and has a quantum well structure.

4. The wavelength-tunable laser apparatus according to claim 3, wherein the second active layer tunes the gain of light which is generated in the first active layer in accordance with the electric current of a predetermined level.

5. The wavelength-tunable laser apparatus according to claim 1, wherein the second grating adjusts an oscillating wave length of the gain-clamped section, wherein the oscillating wavelength of the gain-clamp section has a predetermined difference from an oscillating wavelength of the distributed reflector section, to enable automatic power compensation.

6. A wavelength-tunable laser apparatus comprising: an integrated distributed reflector section, a gain section and a gain-clamped semiconductor optical amplifier section, wherein the gain section adjoins the distributed reflector section and gain-clamped semiconductor optical amplifier section, and includes an active layer, between clad layers of the distributed reflector section, for adjusting the gain of the light.

7. The wavelength-tunable laser apparatus according to claim 6, further comprising: a high reflection layer disposed at an end of the distributed reflector section operable for power boosting, and an antireflection layer disposed at an end of the gain-clamped semiconductor optical amplifier section.

8. The wavelength-tunable laser apparatus according to claim 6, wherein the gain-clamped semiconductor optical amplifier section adjoining the gain section are monolithically integrated.

9. The wavelength-tunable laser apparatus according to claim 6, wherein the clad layers each have a low refractive index in relation to active layers of the apparatus.

* * * * *